United States Patent
Akram et al.

(12) 
(10) Patent No.: US 6,545,356 B2
(45) Date of Patent: *Apr. 8, 2003

(54) GRADED LAYER FOR USE IN SEMICONDUCTOR CIRCUITS AND METHOD FOR MAKING SAME

(75) Inventors: Salman Akram, Boise, ID (US); Scott G. Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/051,768

(22) Filed: Jan. 18, 2002

(65) Prior Publication Data

US 2002/0094652 A1 Jul. 18, 2002

Related U.S. Application Data

(62) Division of application No. 09/887,612, filed on Jun. 22, 2001, now Pat. No. 6,451,658, which is a division of application No. 09/138,811, filed on Aug. 21, 1998, now Pat. No. 6,271,590.

(51) Int. Cl.$^7$ ................................................. H01L 23/48
(52) U.S. Cl. ....................... 257/748; 257/746; 257/764
(58) Field of Search ................................ 257/748, 741, 257/746, 764, 768

(56) References Cited

U.S. PATENT DOCUMENTS

| 5,341,016 A | * | 8/1994 | Prall et al. .................... 257/412 |
| 5,349,205 A | | 9/1994 | Kobayashi et al. ............ 257/59 |
| 5,563,449 A | | 10/1996 | Dion et al. ................... 257/764 |
| 5,675,186 A | | 10/1997 | Shen et al. ................... 257/751 |
| 5,763,948 A | | 6/1998 | Sumi ........................... 257/763 |
| 5,804,878 A | | 9/1998 | Miyazaki et al. ............ 257/764 |
| 6,005,277 A | | 12/1999 | Liu et al. ..................... 257/437 |
| 6,057,603 A | | 5/2000 | Dawson ....................... 257/758 |
| 6,271,590 B1 | * | 8/2001 | Akram et al. ................ 257/748 |

* cited by examiner

*Primary Examiner*—Alexander Ghyka
(74) *Attorney, Agent, or Firm*—Fletcher, Yoder & Van Someren

(57) ABSTRACT

Methods of forming a graded layer is disclosed. The graded layer transitions from one material to another material. The properties of these materials are chosen to optimize the interfaces on each side of the graded layer. Specifically, an improved transistor gate stack barrier layer may be formed by disposing an appropriate graded layer between a gate layer and an interconnect layer. In fact, the graded layer may obviate the use of the interconnect layer, as the top of the graded layer may include a highly conductive material. An improved integrated circuit interconnect structure may also be formed by grading the material composition of an interconnect layer.

41 Claims, 3 Drawing Sheets

GRADED LAYER FOR USE IN SEMICONDUCTOR CIRCUITS AND METHOD FOR MAKING SAME

This application is a Divisional of application Ser. No. 09/887,612, filed on Jun. 22, 2001, which issued on Sep. 17, 2002 as U.S. Pat. No. 6,451,658 B2, which is a Divisional of application Ser. No. 09/138,811, filed on Aug. 21, 1998, which issued on Aug. 7, 2001 as U.S. Pat. No. 6,271,590 B1.

BACKGROUND OF THE INVENTION

1. Field of the Invention

The present invention relates generally to microelectronic or semiconductor circuits and, more particularly, to structures, materials, and methods used to form graded layers that may be used, for example, in a gate stack for a transistor or to form the conductive lines used for interconnecting circuit elements within a microelectronic circuit.

2. Background of the Related Art

Many devices today contain microelectronic or semiconductor circuits. These circuits usually contain a number of circuit elements that perform the desired function of the semiconductor circuit. Semiconductor circuits, such as memories, typically contain thousands of interconnected transistors. Transistors are usually three terminal devices that may take many forms. One type of transistor is known as a field effect transistor (FET). The terminals of a FET are known as a gate, a source, and a drain. Formation of a FET's source and drain regions within a semiconductor's substrate is usually achieved by doping selected regions of the substrate. Formation of a FET's gate is usually achieved by depositing or growing a dielectric oxide layer on top of the substrate between the doped source and drain regions and by depositing a conductive material on top of the gate oxide.

Other layers may be added to the gate region of a FET. The combination of the layers formed over the gate region are referred to collectively as the transistor gate stack. For instance, layers may be formed to interconnect the FET with other portions of the circuit. One interconnecting layer may be formed of semiconductive or conductive material, such as polysilicon, that is deposited on top of the gate oxide. Another interconnecting layer may be formed of conductive material, often a silicide material such as tungsten silicide ($WSi_x$) or titanium silicide ($TiSi_2$), that is deposited on top of the first interconnecting layer. Insulating or barrier layers may also be formed within the gate stack for various reasons.

As the density of semiconductor devices has increased, the dimensions of the features and layers on the semiconductive wafer have become smaller. For instance, the length and width of transistor gates has been reduced, as has the height of the gate stack due to the thinner layers used therein. The various material layers that form an integrated circuit typically are subjected to stress due to differences in their structural properties, and this stress becomes important as the thickness of the various layers increases. More specifically, this stress is caused by differing residual stress levels in adjacent material layers, resulting in part from the thermal expansion properties of adjacent layers. This stress can cause the peeling or separation of one layer from adjacent layers. This peeling or separation is further exacerbated as the silicon wafer size increases. Additionally, wafer warpage tends to increase with wafer size, which further affects the stress in the layers. Thus, as semiconductor device geometries shrink, a need for better adhesion and lower stress between layers, such as the gate dielectric layer and the gate conductive layer, is desirable.

High stress that can lead to peeling or delamination may cause the resistance of the delaminated layers to increase and result in problems, such as increased RC time constants. Therefore, there also exists a need for a gate stack that has a reduced resistivity as compared with previously used gate stacks and that would be suitable for use in very small device geometries, such as those in the sub 0.15 micron range.

Additionally, conductive layers, such as those formed from silicide, may not maintain the desired levels of resistivity and thermal stability over a desired temperature range. For example, there is the need for a barrier layer to maintain these properties when exposed to temperatures exceeding 700° C. during processing steps subsequent to formation of the conductive layer.

The present invention is directed to overcoming, or at least reducing the effects of, one or more of the problems set forth above.

SUMMARY OF THE INVENTION

In accordance with one aspect of the present invention, there is provided a transistor gate stack. The transistor gate stack includes a dielectric layer that is disposed on a substrate. A gate layer is disposed on the dielectric layer. A graded layer is disposed on the gate layer. The graded layer has a first region of a first material and a second region of a second material.

In accordance with another aspect of the present invention, there is provided a layer for use in fabricating an interconnect. A graded layer is disposed between a first material and a second material. The graded layer has a changing material composition from a first region proximate the first material to a second region proximate the second material.

In accordance with a further aspect of the present invention, there is provided a method of forming a transistor gate stack structure. The method includes the steps of forming a dielectric layer on a substrate, forming a gate layer on the dielectric layer, and forming a graded layer on the gate layer, where the graded layer has a first material in a first region and a second material in a second region.

In accordance with yet another aspect of the present invention, there is provided a method of forming a layer for use in fabricating an interconnect. The method includes the step of forming a graded layer between a first material and a second material. The graded material has a changing material composition from a first region proximate the first material to a second region proximate the second material.

In accordance with still another aspect of the present invention, there is provided a transistor gate stack A dielectric layer is disposed on a substrate A gate layer is disposed on the dielectric layer. A graded layer is disposed on the gate layer The graded layer is formed by varying the material composition of the graded layer during deposition of materials forming the graded layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
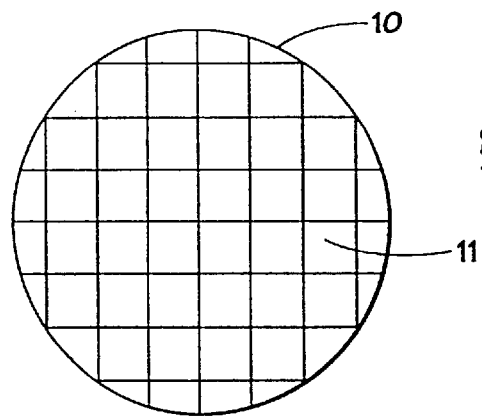
FIG. 1 is a top view of a silicon semiconductor wafer.

Turning now to the drawings, and referring initially to FIG. 1, one or more integrated circuits having one or more graded layers that improve adhesion may be formed on a semiconductor wafer 10. The wafer 10 may be separated into individual integrated circuit dies 11 that may be packaged as integrated circuit chips in any of several well-known packaging configurations.

Figure 2:
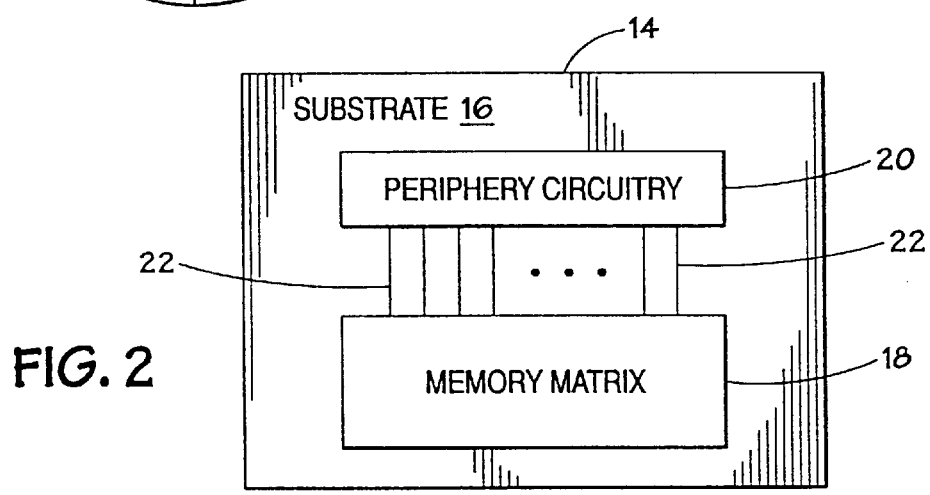
FIG. 2 is a block diagram of a portion of an integrated circuit memory formed on a semiconductor substrate.
Figure 3:
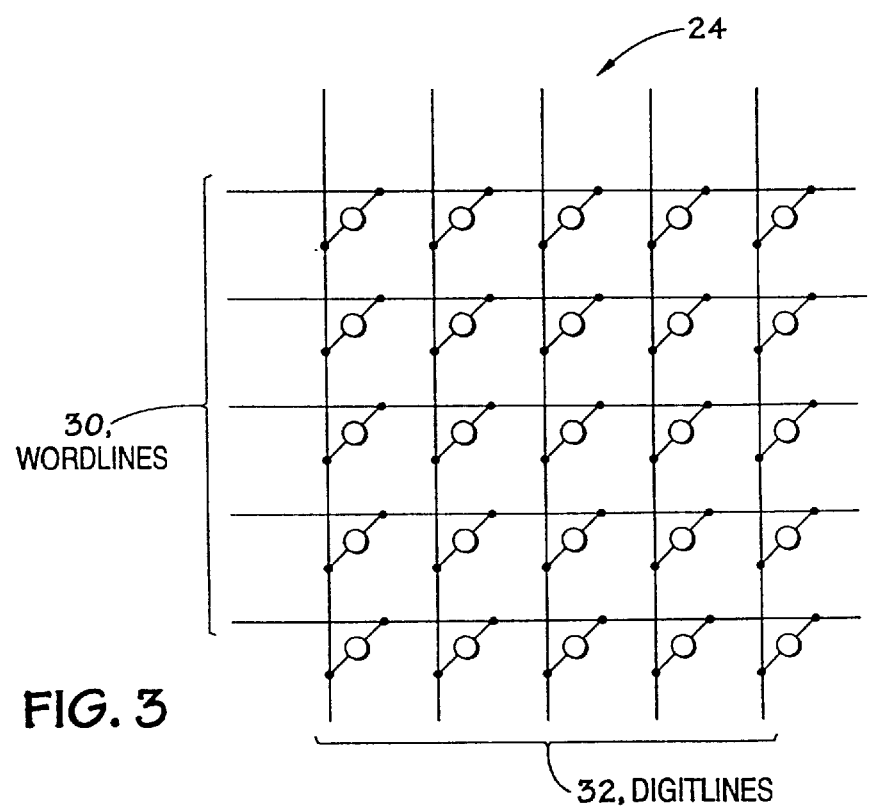
FIG. 3 is a block diagram of a portion of a dynamic random access memory (DRAM) array.

Memory chips, such as a random access memories (RAMs) or read only memories (ROMs), may be fabricated using the graded layers described herein, although integrated circuits designed to perform a number of electronic circuit functions may also be fabricated using such layers. A block diagram of a semiconductor memory 14 is shown generally in FIG. 2. The memory 14 is formed on a semiconductor substrate 16 and contains a memory matrix 18. The memory matrix 18, such as a dynamic random access memory (DRAM) array 24 shown in FIG. 3, is controlled by peripheral circuitry 20 via lines 22.

Figure 4:
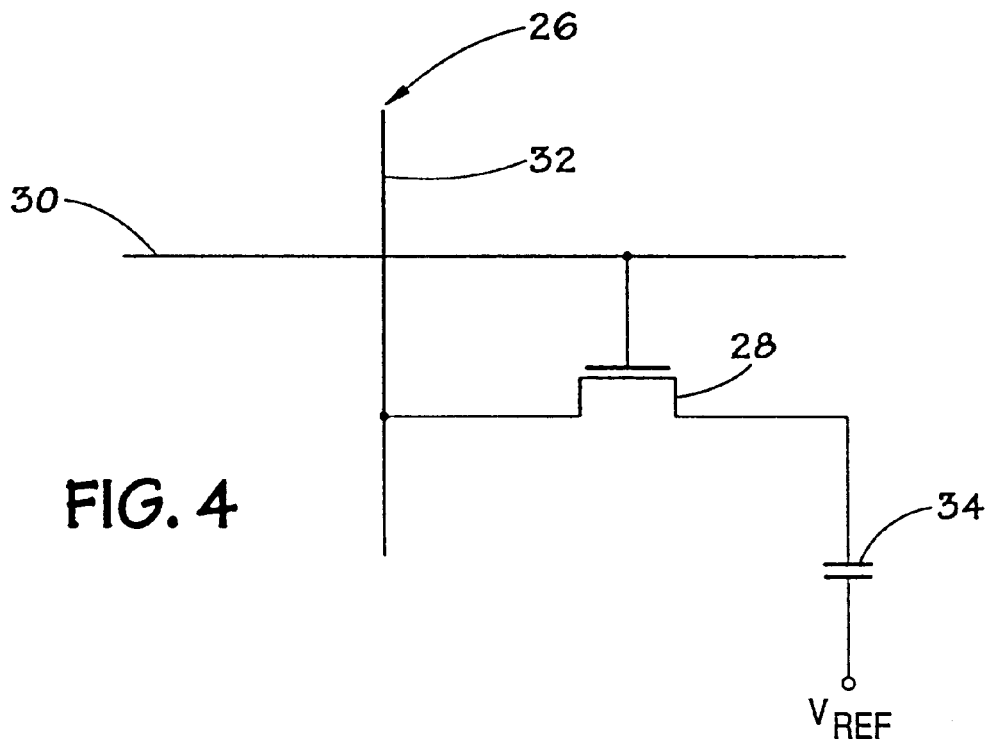
FIG. 4 is a schematic diagram of an example of a DRAM cell.

A schematic of a memory cell, and more specifically a DRAM cell 26, is shown in FIG. 4. The DRAM cell 26 contains an access transistor 28 that controls electrical access to a storage capacitor 34. The access transistor 28 is illustrated as a FET. The gate of the access transistor 28 is electrically connected to a word line 30, and the drain of the FET 28 is electrically connected to a bit line 32. The manner in which a DRAM operates is well-known and will not be described further herein.

Figure 5:
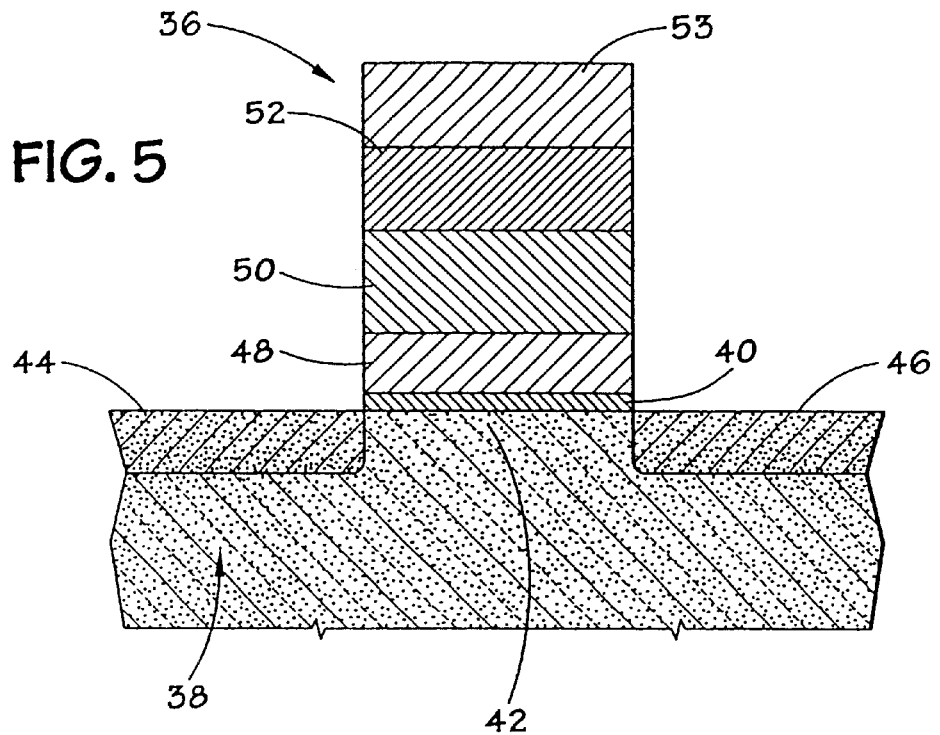
FIG. 5 is a cross-sectional view of a field effect transistor, including a transistor gate stack in accordance with the present invention.

FIG. 5 shows a FET 36, such as that used as the access transistor 28 in the DRAM cell 26, formed in a silicon substrate 38. A gate stack may be formed in a number of ways, but, in this example, the gate stack is formed by depositing the successive layers one on top of the other and, then, performing a photoresist and etch to define the gate stack. In other words, a dielectric layer of gate oxide 40 is deposited on the substrate 38. A gate layer 48, typically a conductive or semiconductive material such as polysilicon, is deposited on the gate oxide layer 40. A graded layer 50 is deposited on the gate layer 48. Other layers, such as an interconnect layer 52 and an insulating layer 53, are then deposited on the graded layer 50. The FET's channel region 42, source region 44, and drain 46 region may be formed by etching windows in the gate stack and by doping the silicon substrate 38 in a conventional fashion, such as ion implantation or diffusion. Typically, the thickness of the gate oxide layer 40 is in the range of 40 Å to 150 Å, and the thickness of the gate layer 48 is in the range of 100 Å to 2000 Å. Of course, as the gate dimensions shrink, the thickness of these layers may be further reduced.

Following the formation of the gate layer 48, a graded layer 50 is formed on the gate layer 48 The graded layer 50 transitions from one material to another material The graded layer 50 may be formed from a number of different elements, compounds, or mixtures, including, for example, titanium (Ti), tungsten (W), nitrogen (N), titanium tungsten (TiW), tungsten nitride (WN), titanium nitride (TiN), titanium tungsten nitride (TiWN), titanium aluminum nitride (TiAlN), titanium suicide (TiSi), or titanium silicon nitride (TiSiN). Because WSi is not used, films having lower resistivity may be achieved. For example, the composition of the graded layer 50 may be varied from (1) TiW to W, where Ti varies from 0.25% to 99.5% and W varies from 0.25% to 99.5%; (2) WN to W, where N varies from 0.25% to 99.5% and W varies from 0.25% to 99.5%; and (3) TiWN to W, where Ti varies from 0.25% to 99.5%, W varies from 0.25% to 99.5%, and N varies from 0.25% to 99.5%.

Figure 6:
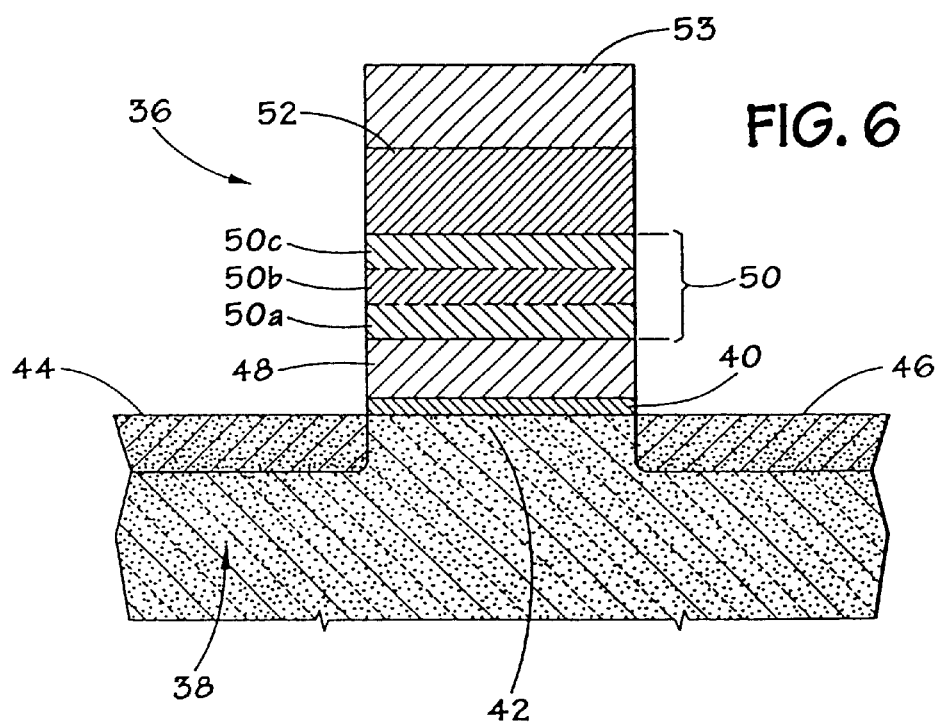
FIG. 6 is a cross-sectional view of a field effect transistor, including a transistor gate stack in accordance with the present invention.

The graded layer 50 may gradually transition from a material comprising a single element, such as tungsten, at the bottom of the graded barrier layer 50 to another material, such as TiW, at the top of the graded layer 50, or the other way around. Alternatively, rather than gradual transition from one material to another, the graded layer 50 may be made of a number of discrete sub-layers. FIG. 6 shows an example of a graded layer 50 formed from three sublayers 50a, 50b, and 50c. Each sublayer 50a, 50b, and 50c may have a particular composition, or each sublayer 50a, 50b, 50c may have a graded variation of materials to achieve the desired effect.

The graded layer 50 is graded from a first material at the portion of the graded layer 50 closest to the gate layer 48, e.g., the bottom of the graded layer 50, to a second material at the portion of the graded layer 50 closest to a subsequently formed layer, e.g., the top of the graded layer 50. By way of example, the bottom of the graded layer 50 may be TiN or TiW, and the top of the graded layer 50 may be pure tungsten. The material ratio of constituent compositional elements of the graded layer 50 may vary according to the respective formula $Ti_x N_{(1-x)}$ or $Ti_x W_{(1-x)}$, such that x equals 0.5 at the bottom of the graded layer 50 and x equals 0 at the top of the graded layer 50. The value of x and the manner in which the value of x changes from the bottom to the top of the graded layer 50 may vary depending upon various factors, such as the type of material in layers adjacent the bottom and top of the graded layer 50.

Typically, the composition of the graded layer 50 is chosen so that its adhesion properties and material stress will be optimized as closely as possible to the adhesion properties and material stress of adjacent layers. For example, if the graded layer 50 is used as a barrier layer between the gate layer 48 and the interconnect layer 52 in a gate stack, the material used to form the bottom of the graded layer 50 may be chosen so that its properties are optimized relative to those of the underlying gate layer 48, and the material used to form the top of the graded layer 50 may be chosen so that its properties are optimized relative to those of the overlying conductive interconnect layer 52.

A number of different methods may be used to form the graded layer 50, but sputtering is one particularly useful method of forming the graded layer 50. A single sputtering target may contain the materials used in the graded layer 50. Alternatively, multiple sputtering targets, each containing a different material, may be used. Generally, conventional sputtering techniques may be used to deposit the graded layer 50. Various sputtering machines, such as the Eclipse available from Material Research Corporation or the Endura available from Applied Materials, may be utilized to sputter a graded layer of the desired thickness, typically in the range of 50 Å to 20,000 Å.

For example, if a graded layer 50 has a TiW bottom portion and a pure tungsten top portion, a single sputtering target may contain a varying mixture of tungsten and titanium. The mixture may vary from a particular TiW compound at the center of the target and change, gradually or abruptly, to a composition of pure tungsten at the target's periphery. For instance, the TiW compound at the center of the target may be graduated to 100% tungsten at a radial distance of 40% to 60% of the radial length from the center of the target. The percentage of tungsten may be varied in a linear or nonlinear fashion from the target's center to its periphery, and the sputtering process may progress from the center of the sputtering target to the target edges in a linear or nonlinear fashion. Of course, if multiple sputtering targets are used in the above example, the process for sputtering the graded layer 50 may include a series of successive sputtering steps, each utilizing one of the multiple sputtering targets to achieve the desired gradation within the graded layer 50.

The graded layer 50 may also be deposited using chemical vapor deposition (CVD), including PECVD and OMCVD. If CVD is used to create the graded layer 50, the gas flow, concentration, and/or composition may be varied during the deposition of the graded layer 50 to create the desired compositional grading. For instance, if the desired graded layer 50 transitions from WN to TiWN, then a suitable source, such as an organometallic source, is used for each constituent component Ti, W, and N, and the flow, concentration, and/or composition of each source may be varied to deposit the desired graded layer 50. As another example, if a graded layer 50 that transitions from WN to tungsten is desired, the gas may initially include tungsten fluoride, ammonia, nitrogen, and argon. The transition is effected by tapering off the flows of ammonia and nitrogen.

As shown in FIG. 5, an interconnect layer 52 may be formed on top of the graded layer 50. The interconnect layer 52 may be deposited by conventional techniques, such as sputtering or CVD. The interconnect layer 52 couples the transistor's gate to other circuit elements. The interconnect layer 52 is typically formed from a conductive material, such as tungsten, and it typically has a thickness of 1000 Å-2000 Å. On top of this interconnect layer can be formed an insulative layer 53 such as a nitride.

One further advantage of the graded layer 50 is that it may eliminate the need for an overlying conductive interconnect layer, such as the interconnect layer 52. As an example, the graded layer 50 may be graded from a tungsten nitride (WN) at its bottom to 100% tungsten, or some other highly conductive material at its top. Because the top portion of the graded layer 50 is highly conductive, the conductive interconnect layer 52, distinct from the graded barrier layer 50, may be eliminated.

The methods and materials described above in reference to the gate stack having the graded barrier layer 50 may be used to form other structures within an integrated circuit, such as multilevel interconnects. By way of example, DRAM bit lines 32, as shown in FIG. 4, may be formed from a graded interconnect layer deposited on a semiconductor substrate or other underlying structure, using a process such as that described above.

Figure 7:
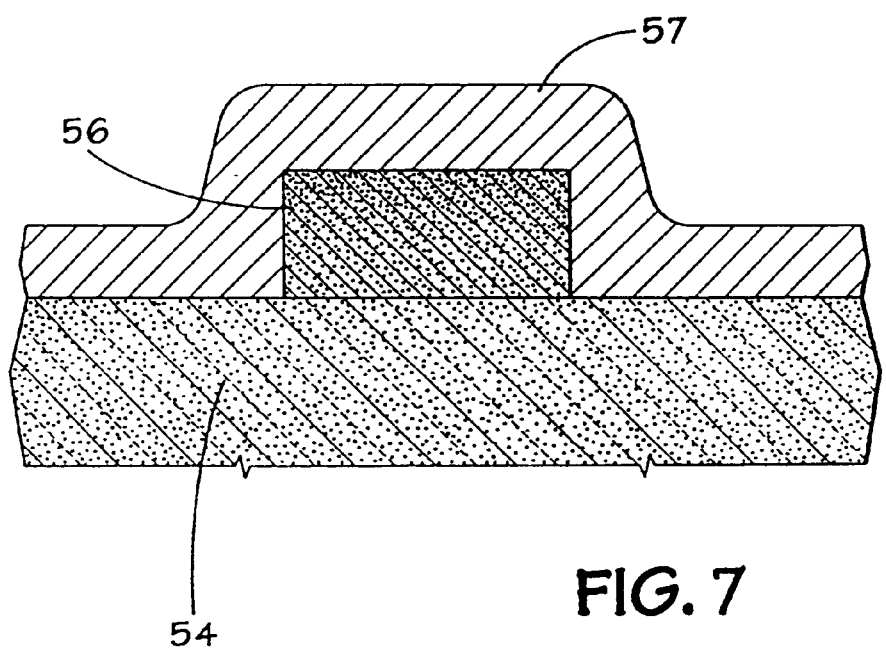
FIG. 7 is a cross-sectional view of a graded interconnect layer disposed on a silicon substrate.

As shown in FIG. 7, if a graded interconnect layer 56 is deposited on a semiconductor substrate 54, the graded interconnect layer 56 may be graded from titanium tungsten at the interconnect's interface with the substrate 54 to pure tungsten at the top of the graded interconnect layer 56. The graded interconnect layer 56 will typically be in the range of 50 Å to 20,000 Å, but preferably will be of 8000 Å to 10,000 Å in thickness. An insulating layer 57, or other layers, may be deposited over the top and sides of the interconnect layer 56.

A graded interconnect layer 56 as described herein may also be used in a multilevel metalization system in which: a first interconnecting network may be formed; a dielectric layer may be formed on top of the first interconnecting network; and a second interconnecting network may be formed on top of the dielectric layer.

It should be understood that while any of the layers disclosed herein, e.g., the gate layer 48 or graded layer 50, may be referred to as a layer (as these may be deposited in a single step but have varying intrinsic concentration during deposition), although these layers may not necessarily be of a uniform thickness.

Although the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A transistor gate stack, comprising:
   a dielectric layer disposed on a substrate;
   a gate layer disposed on said dielectric layer; and
   a graded layer disposed on said gate layer, said graded layer having a first region of a first material and a second region of a second material wherein the first region has stress and adhesive properties substantially matched to stress and adhesive properties of the gate layer and the second region has stress and adhesive properties substantially matched to stress and adhesive properties of an overlying layer.

2. The transistor gate stack of claim 1, wherein said second region has a different chemical composition than said first region.

3. The transistor gate stack of claim 1, wherein said first material comprises at least one of titanium tungsten, titanium tungsten nitride, tungsten nitride, titanium aluminum nitride, titanium silicide, and titanium silicon nitride.

4. The transistor gate stack of claim 1, wherein said second material comprises at least one of tungsten, tungsten nitride, and titanium tungsten.

5. The transistor gate stack of claim 1, wherein said first material comprises titanium tungsten and said second material comprises tungsten.

6. The transistor gate stack of claim 1, wherein said first material comprises tungsten nitride and said second material comprises tungsten.

7. The transistor gate stack of claim 1, wherein said first material comprises titanium tungsten nitride and said second material comprises tungsten.

8. The transistor gate stack of claim 1, wherein said first material comprises titanium tungsten nitride and said second mate rial comprises titanium tungsten.

9. The transistor gate stack of claim 1, wherein said graded layer gradually transitions from said first material to said second material.

10. The transistor gate stack of claim 1, wherein said graded layer comprises a plurality of sublayers.

11. The transistor gate stack of claim 10, wherein each of said plurality of sublayers is comprised of a particular respective material.

12. The transistor gate stack of claim 1, further comprising a conductive interconnect layer disposed on said graded layer.

13. The transistor gate stack of claim 1, further comprising an interconnect layer disposed on said second region of said graded layer.

14. The transistor gate stack of claim 1, wherein said first material comprises 50% tungsten and 50% nitrogen, and wherein said second material comprises more than 99% tungsten and less than 1% nitrogen.

15. The transistor gate stack of claim 1, wherein the first material comprises titanium tungsten and wherein the second material comprises tungsten, wherein titanium concentration is in a range from 0.25% to 99.5% and tungsten concentration is in a range from 0.25% to 99.5%.

16. The transistor gate stack of claim 1, wherein the first material comprises tungsten nitride and wherein the second material comprises tungsten, wherein nitrogen concentration is in a range from 0.25% to 99.5% and tungsten concentration is in a range from 0.25% to 99.5%.

17. The transistor gate stack of claim 1, wherein the first material comprises titanium tungsten nitride and wherein the second material comprises tungsten, wherein nitrogen concentration is in a range from 0.25% to 99.5%, tungsten concentration is in a range from 0.25% to 99.5%, and titanium concentration is in a range from 0.25% to 99.5%.

18. An interconnect layer for use in fabricating a microelectronic device, comprising:
a graded layer disposed between a first material and a second material, said graded layer having a changing material composition from a first region proximate said first material to a second region proximate said second material wherein the first region has stress and adhesive properties substantially matched to stress and adhesive properties of the first material and the second region has stress and adhesive properties substantially matched to stress and adhesive properties of the second material.

19. The layer of claim 18, wherein said first region of said graded layer comprises said fit material, and wherein said second region of said graded layer comprises said second material.

20. The layer of claim 18, wherein said graded layer gradually transitions from a first given material in said first region to a second given material in said second region.

21. The layer of claim 18, wherein said graded layer comprises a plurality of sublayers.

22. The layer of claim 21, wherein each of said plurality of sublayers is comprised of a particular respective material.

23. The layer of claim 21, wherein each of said plurality of sublayers is graded and comprised of more than one material.

24. A transistor gate stack, comprising:
a dielectric layer disposed on a substrate;
a gate layer disposed on said dielectric layer; and
a graded layer disposed upon said gate layer, said graded layer being formed by varying the material composition of said graded layer during deposition of materials forming said graded layer wherein a region of the graded layer adjacent to the gate layer has stress and adhesive properties substantially matched to the stress and adhesive properties of the gate layer and a region of the graded layer adjacent to an overlying layer has stress and adhesive properties substantially matched to the stress and adhesive properties of the overlying layer.

25. An integrated circuit memory device, comprising:
a memory array having a plurality of memory cells, wherein the memory array comprises a graded layer disposed between a first material and a second material, said graded layer having a changing material composition from a first region proximate said first material to a second region proximate said second material such that the first region has stress and adhesive properties substantially matched to stress and adhesive properties of the first material and the second region has stress and adhesive properties substantially matched to stress and adhesive properties of the second material.

26. A layer for use in fabricating a microelectronic device, comprising:
a graded layer having a first region of a first material and a second region of a second material wherein the first region has stress and adhesive properties substantially matched to stress and adhesive properties of an underlying layer and the second region has stress and adhesive properties substantially matched to stress and adhesive properties of an overlaying layer.

27. The layer of claim 26, the second region has a different chemical composition than the first region.

28. The layer of claim 26, wherein the first material comprises at least one of titanium tungsten, titanium tungsten nitride, tungsten nitride, titanium aluminum nitride, titanium suicide, and titanium silicon nitride.

29. The layer of claim 26, wherein the second material comprises at least one of tungsten, tungsten nitride, and titanium tungsten.

30. The layer of claim 26, the first material comprises titanium tungsten and the second material comprises tungsten.

31. The layer of claim 26, wherein the first material comprises tungsten nitride and the second material comprises tungsten.

32. The layer of claim 26, wherein the first material comprises titanium tungsten nitride and the second material comprises tungsten.

33. The layer of claim 26, wherein the first material comprises titanium tungsten nitride and the second material comprises titanium tungsten.

34. The layer of claim 26, wherein the graded layer gradually transitions from the first material to the second material.

35. The layer of claim 26, wherein the graded layer comprises a plurality of sublayers.

36. The layer of claim 35, wherein each of the plurality of sublayers is comprised of a particular respective material.

37. The layer of claim 26, wherein the first material comprises 50% tungsten and 50% nitrogen, and wherein the second material comprises more than 99% tungsten and less than 1% nitrogen.

38. The layer of claim 26, wherein the first material comprises titanium tungsten and wherein the second material comprises tungsten, wherein titanium concentration is in a range from 0.25% to 99.5% and tungsten concentration is in a range from 0.25% to 99.5%.

39. The layer of claim 26, wherein the first material comprises tungsten nitride and wherein the second material comprises tungsten, wherein nitrogen concentration is in a range from 0.25% to 99.5% and tungsten Concentration is in a range from 0.25% to 99.5%.

40. The layer of claim 26, wherein the first material comprises titanium tungsten nitride and wherein the second material comprises tungsten, wherein nitrogen concentration is in a range from 0.25% to 99.5%, tungsten concentration is in a range from 0.25% to 99.5%, and titanium concentration is in a range from 0.25% to 99.5%.

41. A transistor gate stack, comprising:
a substrate;
a dielectric layer disposed upon the substrate;
a gate layer disposed on said dielectric layer wherein the gate layer is conductive or semiconductive;

a graded layer disposed on said gate layer wherein the graded layer has a first region of a first material adjacent to the gate layer and a second region of a second material; and a conductive interconnect layer disposed on said graded layer adjacent to the second region.

\* \* \* \* \*